United States Patent
Kim et al.

(10) Patent No.: US 7,091,117 B2
(45) Date of Patent: Aug. 15, 2006

(54) METHOD OF FABRICATING A SEMICONDUCTOR DEVICE

(75) Inventors: Jae-Woo Kim, Sungnam-si (KR); Yong-Sun Ko, Suwon-si (KR); Sang-Sup Jeong, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 91 days.

(21) Appl. No.: 10/836,694

(22) Filed: Apr. 30, 2004

(65) Prior Publication Data

US 2004/0253800 A1   Dec. 16, 2004

(30) Foreign Application Priority Data

Jun. 12, 2003   (KR) ............... 10-2003-0037963

(51) Int. Cl.
*H01L 21/3205* (2006.01)
*H01L 21/4763* (2006.01)

(52) U.S. Cl. ............... 438/585; 438/595; 438/596

(58) Field of Classification Search ............ 438/585, 438/595, 596
See application file for complete search history.

(56) References Cited

U.S. PATENT DOCUMENTS

| | | | |
|---|---|---|---|
| 6,270,929 B1 * | 8/2001 | Lyons et al. | 430/5 |
| 6,930,028 B1 * | 8/2005 | Hanratty et al. | 438/585 |
| 2003/0006410 A1 * | 1/2003 | Doyle | 257/20 |

FOREIGN PATENT DOCUMENTS

JP          00315661      11/2001

OTHER PUBLICATIONS

Manufacture for Semiconductor Device, Yoshimune Hiroyasu, Japan Patent JP2000315661, Publication Date Nov. 14, 2000.*
English Abstract.

* cited by examiner

*Primary Examiner*—W. David Coleman
*Assistant Examiner*—Khiem Nguyen
(74) *Attorney, Agent, or Firm*—F. Chau & Associates, LLC

(57) ABSTRACT

A method of fabricating a semiconductor device including sequentially forming a polysilicon layer, a first insulating layer, and a photoresist layer over a gate oxide film positioned on a semiconductor substrate. A photoresist pattern with a first groove is formed by selectively patterning the photoresist layer to partially expose a surface of the first insulating layer. A second insulating layer is formed over the photoresist pattern with the first groove and over the exposed surface of the first insulating layer. A sacrificial spacer is formed on each inner wall of the first groove by etching back the second insulating layer and forming a second groove in the first insulating layer in communication with the first groove to expose a surface of the polysilicon layer at the bottom of the second groove. The photoresist pattern is removed, and an arbitrary layer pattern is formed over the polysilicon layer at the bottom of the second groove. The sacrificial spacers and first insulating layer are removed, and a gate electrode is formed by etching the polysilicon layer using the arbitrary layer pattern as a mask.

17 Claims, 7 Drawing Sheets

METHOD OF FABRICATING A SEMICONDUCTOR DEVICE

BACKGROUND

1. Technical Field

The present disclosure relates, in general, to a method of fabricating a semiconductor device and, more particularly, to a method of fabricating a transistor capable of realizing a gate electrode in a fine pitch structure.

2. Discussion of Related Art

Market competitiveness in semiconductor technologies depends to some extent on how many logic devices can be mounted on a small area. Accordingly, one of the most important issues in developing and manufacturing semiconductor products is the downsizing of semiconductor chips. Currently, the downsizing of semiconductor devices is being heavily researched.

When a semiconductor device is highly integrated and downsized, it is difficult to realize a desirable small-sized pattern profile because the minimum allowable line width is reduced. For example, a width of a gate electrode is 500 nm in a 16 MB D-RAM and is reduced to 350 nm in a 64 MB D-RAM. Similarly, the width of the gate electrode is reduced to 250 to 300 nm in a 256 MB D-RAM and to 100 nm or less in a 512 MB D-RAM.

Conventional methods of forming a gate electrode include directly etching a polysilicon layer under a photoresist pattern (hereinafter, referred to as 'PR pattern') using the PR pattern as a mask. However, these conventional methods are only applicable to a gate size with a width of 200 nm or more or a gate oxide structure having a thickness of 50 Å or more. This is because it is difficult to control a pattern profile during the etching process because the profile deformation phenomenon of the PR pattern (e.g. collapse of the PR pattern) occurs at 160° C. or higher, and also an overetching phenomenon occurs, in which a portion of the gate oxide is etched when the polysilicon layer is etched, because an etching selectivity to the gate oxide is not sufficiently secured.

Therefore, the above-described conventional method is not suitable for the formation of a thin gate oxide and a small pitch structure except in some special cases.

In other conventional methods, the gate electrode is formed using a hard mask made of SiN or SiON. Unlike the conventional method directly using the PR pattern as the mask to form the gate electrode, an etching process using the hard mask includes forming the hard mask using a PR pattern as a mask, and then forming the gate electrode using the hard mask.

According to the conventional etching technology. using the hard mask, a thickness of the gate oxide can be reduced to less than 50 Å (e.g. 10 to 20 Å) and a sectional profile can be controlled in a small-sized gate process while designing the semiconductor device because the etching selectivity of the gate oxide to the PR mask is sufficiently high during etching of the polysilicon layer.

FIGS. 1 to 4 show steps of a conventional method of forming a gate electrode of a transistor using a hard mask. As shown in FIG. 1, a gate oxide 20 is formed on a semiconductor substrate 10, and then a polysilicon layer 30 is formed on the gate oxide 20.

An insulating layer 40 made of Si(O)N which is to be used as a hard mask layer is formed on the polysilicon layer 30. A PR pattern 50 is formed on the insulating layer 40 using a photolithography process. The insulating layer 40 has a thickness of h.

As shown in FIG. 2, a hard mask 40a is formed by etching the insulating layer 40 using the PR pattern 50 as a mask.

As shown in FIG. 3, the PR pattern 50 on the hard mask 40a is removed by an ashing and strip process, with only the hard mask 40a remaining on the polysilicon layer 30.

As shown in FIG. 4, a gate electrode 30a is formed by etching the polysilicon layer 30 using the hard mask 40a. The thickness of the hard mask 40a is reduced to h' after the completion of the etching process. The reason for the reduction in thickness is that the hard mask 40a is partially consumed when the polysilicon layer 30 is etched.

When a general deposition thickness of the polysilicon layer 30 is 1500 to 2000 Å and an initial deposition thickness (h) of the insulating layer 40 is about 800 Å, a remaining thickness (h') of the insulating layer is about 200 Å. As a result, the gate electrode 30a with a width of $t$ is formed. The width $t$ that can be realized using this conventional process is about 100 nm.

The hard mask 40a remaining on the gate electrode 30a is then removed using an etchant having a desirable etch selectivity to the polysilicon layer, for example, an ARL (anti-reflective layer) etchant (NAE), thereby accomplishing the process.

The gate electrode 30a may be directly used in subsequent processing or after a silicide layer is formed on the gate electrode 30a. Subsequent processing may include, for example, deposition of an interlayer dielectric (ILD) film or a self-aligned contact (SAC) process without removing the hard mask 40a after the gate electrode 30a is formed.

Although the above-mentioned process can secure an etching selectivity to the thin gate oxide film, it cannot obtain a gate electrode in a fine pitch structure with a width of 100 nm or less. This is because the conventional method cannot form a PR pattern used as a masking layer during the formation of a hard mask with a width of 100 nm or less because of limits in the photolithography process.

Accordingly, there is a need for a process that can fabricate a gate electrode with a width of 100 nm or less to accommodate increased integration of semiconductor devices.

SUMMARY OF THE INVENTION

A method of fabricating a semiconductor device according to an exemplary embodiment of the present invention includes sequentially forming a polysilicon layer, a first insulating layer, and a photoresist layer over a gate oxide film positioned on a semiconductor substrate. A photoresist pattern with a first groove is formed by selectively patterning the photoresist layer to partially expose a surface of the first insulating layer. A second insulating layer is formed over the photoresist pattern with the first groove and over the exposed surface of the first insulating layer. A sacrificial spacer is formed on each inner wall of the first groove by etching back the second insulating layer and forming a second groove in the first insulating layer in communication with the first groove to expose a surface of the polysilicon layer at the bottom of the second groove. The photoresist pattern is removed, and an arbitrary layer pattern is formed over the polysilicon layer at the bottom of the second groove. The sacrificial spacers and first insulating layer are removed, and a gate electrode is formed by etching the polysilicon layer using the arbitrary layer pattern as a mask.

In at least one embodiment of the invention, the first insulating layer is made of $SiO_2$ or Si(O)N, and the second insulating layer is formed by a low temperature chemical vapor deposition (LT CVD) process or an atomic layer deposition (ALD) process. Furthermore, it is preferable that the second insulating layer is formed at a temperature of 0.7 T to 0.9 T, where T is a burning temperature of the photoresist layer, and a thickness of the second insulating layer is 350 Å or less.

When the second insulating layer is made of a $SiO_2$-based material, the sacrificial spacers are removed by a wet etching process using an LAL as an etchant. On the other hand, when the second insulating layer is made of a Si(O)N-based material, the sacrificial spacers are removed by a wet etching process using phosphoric acid ($H_3PO_4$) as an etchant.

The arbitrary layer pattern is made of an oxide layer or a suicide layer. The oxide layer is formed by a thermal oxidation process, and the suicide layer is formed by depositing a refractory metal over the semiconductor substrate after the photoresist pattern is removed, reacting the refractory metal with the polysilicon layer at the bottom of the second groove through a heat-treatment process and removing the refractory metal which is not reacted.

When the first and second insulating layers are made of a $SiO_2$-based material, the arbitrary layer pattern is a silicide layer, and when the first and second insulating layer are made of a Si(O)N-based material, the arbitrary layer pattern is an oxide layer or a silicide layer.

When the first and second insulating layers are made of materials having different etching selectivity, such as, for example, when the first insulating layer is made of a $SiO_2$-based material and the second insulating layer is made of a Si(O)N-based material, or when the first insulating layer is made of a Si(O)N-based material and the second insulating layer is made of a $SiO_2$-based material, the arbitrary layer pattern is a silicide layer.

A method of fabricating a semiconductor device according to another embodiment of the invention includes sequentially forming a polysilicon layer, a first insulating layer, and a photoresist layer over a gate insulating layer positioned on a semiconductor substrate. A photoresist pattern with a first groove is formed by selectively patterning the photoresist layer to partially expose a surface of the first insulating layer. The first insulating layer is etched using the photoresist pattern as a mask to form a second groove in the first insulating layer that exposes a surface of the conductive layer. A second insulating layer is formed over the photoresist pattern with the first groove and over the exposed surface of the first insulating layer. A sacrificial spacer is formed on each inner wall of the first groove by etching back the second insulating layer to expose the surface of the conductive layer at the bottom of the second groove. The photoresist pattern is removed, and an arbitrary layer pattern is formed over the polysilicon layer at the bottom of the second groove. The sacrificial spacers and first insulating layer are removed, a gate electrode is formed by etching the polysilicon layer using the arbitrary layer pattern as a mask.

BRIEF DESCRIPTION OF THE DRAWINGS

The present invention will become readily apparent by reference to the following detailed description when considered in conjunction with the accompanying drawings wherein:.

DESCRIPTION OF PREFERRED EMBODIMENTS

Figure 1:
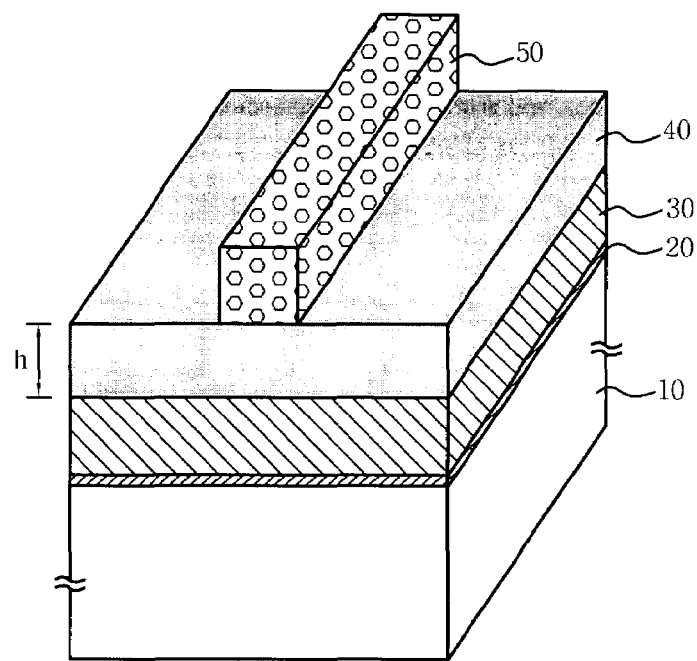
FIGS. 1 to 4 are perspective views illustrating the formation of a gate electrode of a transistor according to the conventional art.
Figure 2:
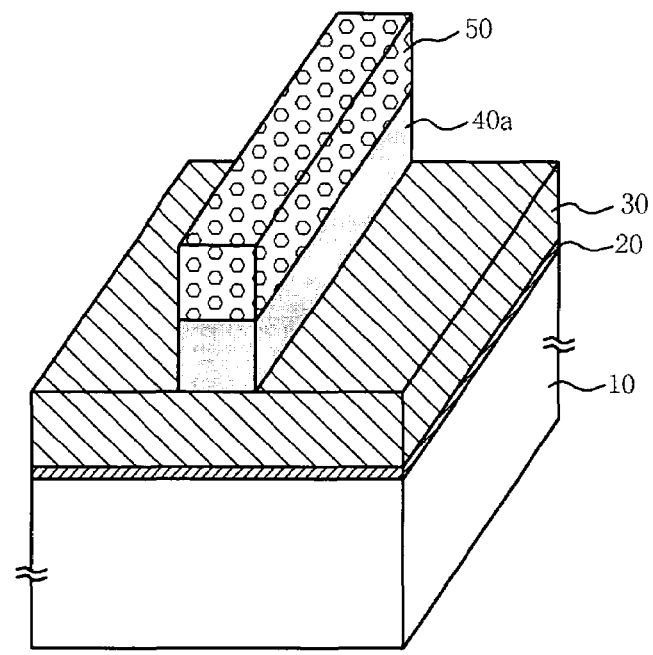
Figure 3:
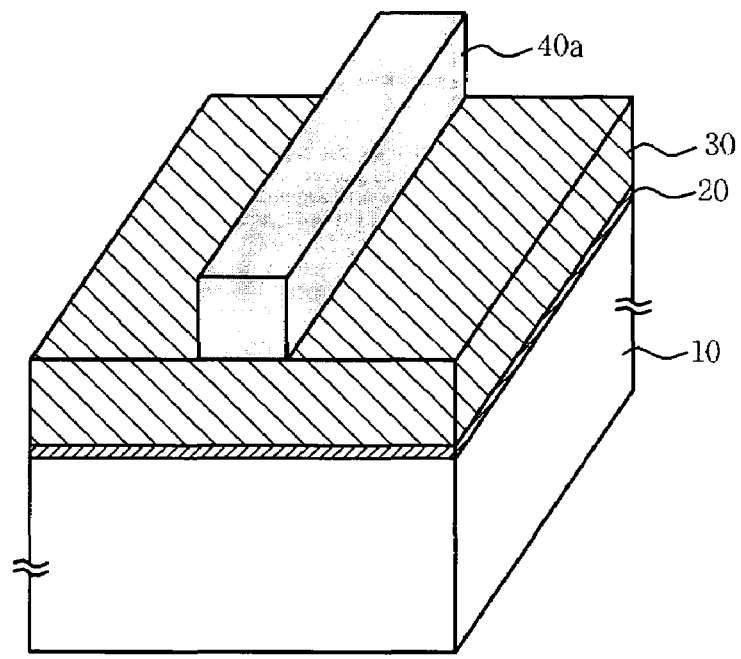
Figure 4:
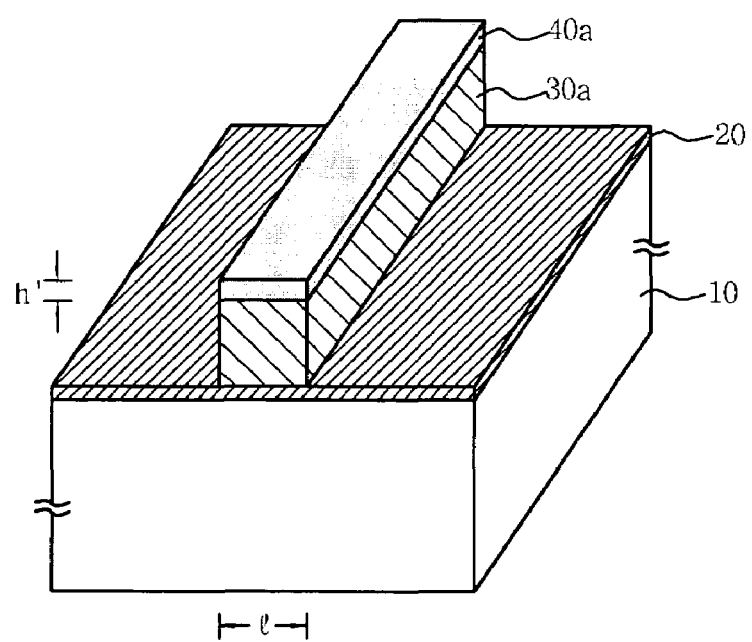

Reference should now be made to the drawings, in which the same reference numerals are used throughout the different drawings to designate the same or similar components.

FIGS. 5 to 10 are perspective views illustrating the formation of a gate electrode of a transistor according to an embodiment of the present invention.

Figure 5:
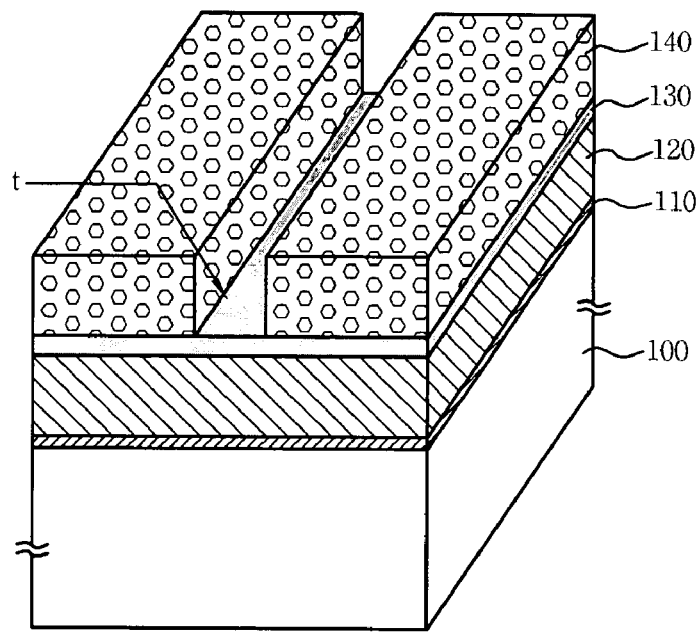
FIGS. 5 to 10 are perspective views illustrating the formation of a gate electrode of a transistor according to an embodiment of the present invention.

As shown in FIG. 5, a gate insulating layer 110, a polysilicon layer 120, and a first insulating layer 130 are sequentially layered on a semiconductor substrate 100. A PR layer with a thickness of 1500 to 3000 Å is formed on the first insulating layer 130. The first insulating layer 130 is made of $SiO_2$ or Si(O)N, and the PR layer is made of KrF or ArF.

A PR pattern 140 with a groove (t) is formed by selectively patterning the PR layer to expose a predetermined part of the surface of the first insulating layer 130.

Figure 6:
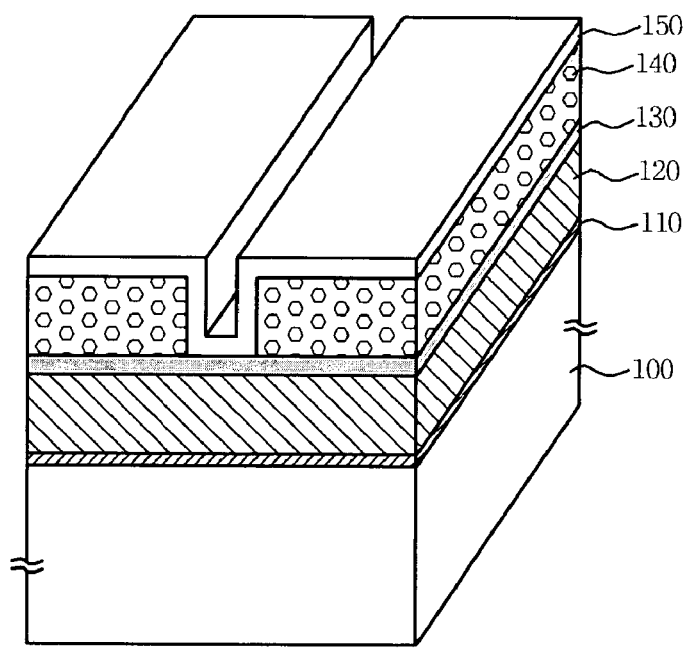

As shown in FIG. 6, a second insulating layer 150 constituting sacrificial spacers is formed on the PR pattern 140 with the groove (t) and on the exposed portion of the first insulating layer 130. The second insulating layer 150 is formed by LT CVD (low temperature chemical vapor deposition) or ALD(automatic layer deposition) so that the PR pattern 140 is not affected, and its thickness is preferably 350 Å or less in consideration of an aspect ratio of the groove (t).

The second insulating layer 150 is preferably deposited at a temperature that is lower than the burning temperature of the PR layer. For example, if the burning temperature of the PR layer is T, it is preferable to perform the film deposition at a temperature of 0.7 T to 0.9 T.

Figure 7:
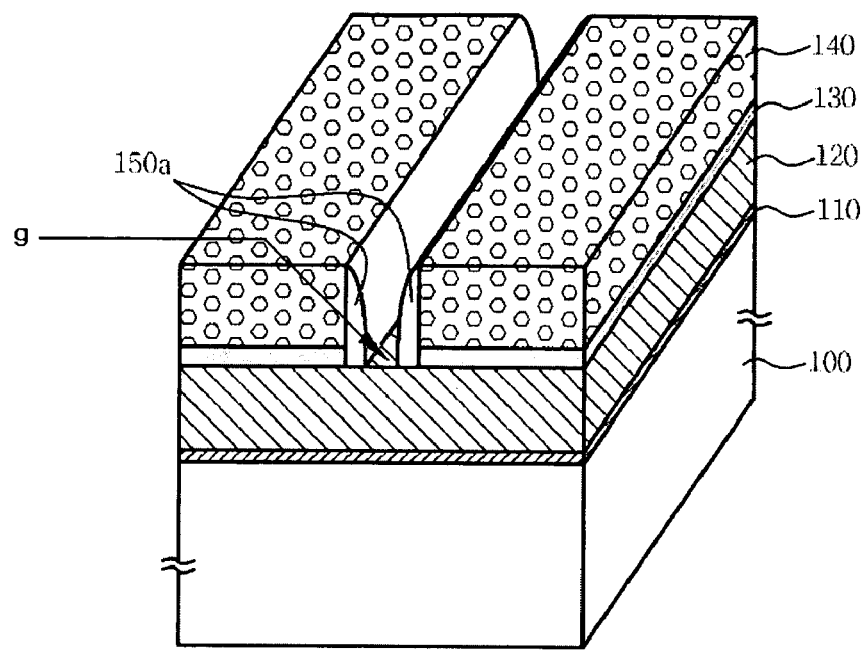

As shown in FIG. 7, the first insulating layer 130 and the second insulating layer 150 are subjected to an etch-back process to form sacrificial spacers 150a on both inner walls of the groove (t). The etch back process results in a groove (g) formed in the first insulating layer 130 that is in communication with the groove (t) formed in the PR pattern 140. The polysilicon layer 120 is exposed to the bottom of the groove(g).

Referring to the FIG. 7, it can be seen that the groove (g) may be made very small by controlling the thicknesses of the film of the sacrificial spacers 150a.

Figure 8:
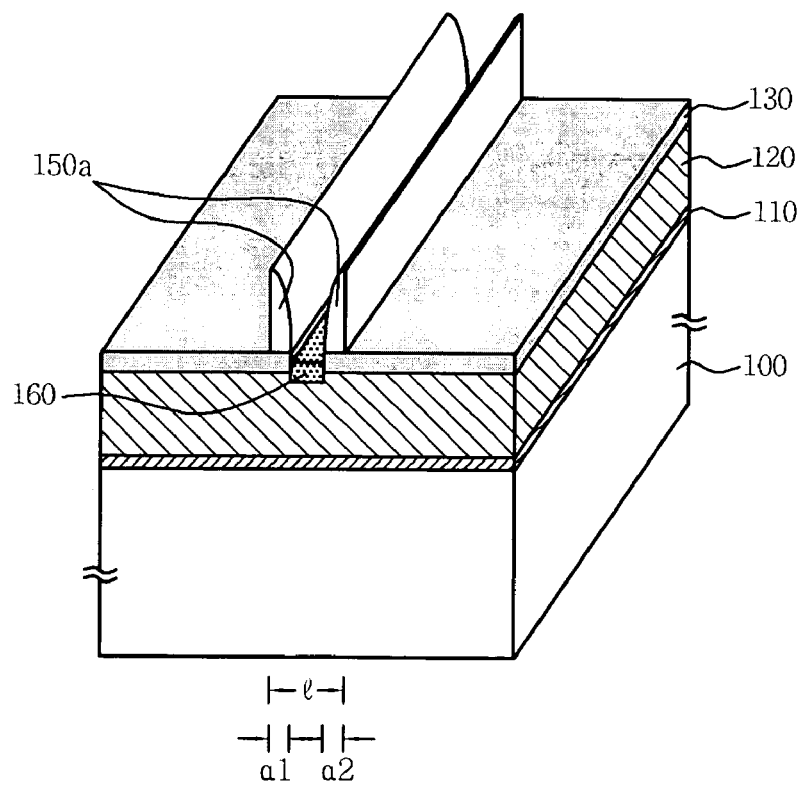

As shown in FIG. 8, after removing the PR pattern 140 by an ashing and a strip process and leaving the first insulating layer 130 and the sacrifice spacers 150a on the polysilicon layer 120, an arbitrary layer pattern 160 is selectively formed only at the bottom of the groove (g). The arbitrary layer pattern 160 may be made of an oxide layer using a thermal oxidation process, or may be made of a silicide layer using a salicide process.

For example, when the first and second insulating layers 130 and 150 are made of a $SiO_2$-based material, the arbitrary layer pattern 160 is made of a silicide layer. On the other hand, when the first and second insulating layers 130 and 150 are made of a Si(O)N-based material, the arbitrary layer pattern 160 is made of an oxide layer or a silicide layer. Additionally, when the first and second insulating layers 130 and 150 are made of materials having different etching selectivity, such as, for example, when the first insulating layer 130 is made of a $SiO_2$-based material and the second insulating layer 150 is made of a Si(O)N-based material, or when the first insulating layer 130 is made of a Si(O)N-based material and the second insulating layer 150 is made of a SiO$_2$-based material, the arbitrary layer pattern 160 is made of a silicide layer.

The first insulating layer 130 and sacrificial spacers 150a act as a blocking layer (BL) while the arbitrary layer pattern 160 is formed.

As an example, when the first insulating layer 130 is made of the Si(O)N-based material and the second insulating layer 150 is made of the SiO$_2$-based material, an arbitrary layer pattern 160 including a silicide layer is formed by depositing a refractory metal such as W, Co, Ti, or Ni on the semiconductor substrate 100 after the PR pattern 140 is removed. The substrate 100 is then heat-treated. At this time, the region of the polysilicon layer 120 exposed at the bottom of the groove (g) reacts with the refractory metal to form a silicide layer made of a low resistance metal. The regions of the polysilicon layer 120 blocked by the first insulating layer 130 and the sacrificial spacers 150a do not react with the refractory metal. The refractory metal remaining on the first insulating layer 130 is removed using sulfuric acid.

The arbitrary layer pattern 160 at the bottom of the groove (g) is used as a hard mask in subsequent processing. If the width of the groove (g) is $t$ and the widths of the sacrificial spacers 150a are respectively $\alpha 1$ and $\alpha 2$, a width of the arbitrary layer pattern 160 is "$t - (\alpha 1 + \alpha 2)$".

Accordingly, in exemplary embodiments of the present invention, a hard mask can be patterned to a small size.

Figure 9:
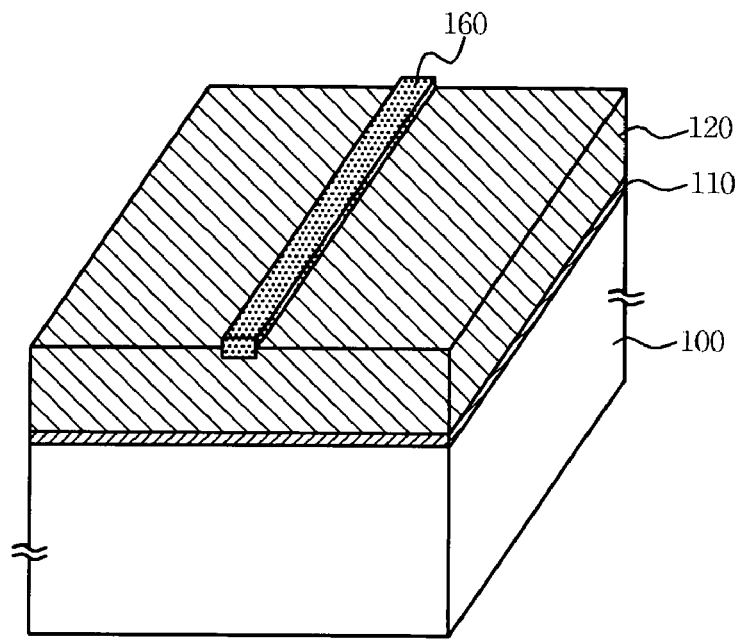

As shown in FIG. 9, the sacrificial spacers 150a and the first insulating layer 130 are sequentially removed to leave only the arbitrary layer pattern 160 on the polysilicon layer 120. The sacrificial spacers 150a are removed by an etchant with a high etching selectivity to the polysilicon layer 120. For example, if the spacers 150a are made of SiO$_2$ using an LT CVD process or an ALD process, the sacrifice spacers 150a are removed by LAL. On the other hand, if the spacers are made of Si(O)N using an LT CVD process or an ALD process, the sacrificial spacers 150a are removed by phosphoric acid (H$_3$PO$_4$). Furthermore, the first insulating layer 130 is removed by LAL when it is made of SiO$_2$, and is removed by phosphoric acid when it is made of Si(O)N.

In other words, when the first and second insulating layers 130, 150 are made of a SiO$_2$-based material, the sacrificial spacers 150a and the first insulating layer 130 are removed according to a wet etching process using LAL as the etchant, and when the first and second insulating layers 130, 150 are made of an Si(O)N-based material, the sacrificial spacers 150a and the first insulating layer 130 are removed according to a wet etching process using phosphoric acid as the etchant. On the other hand, when the first insulating layer 130 is made of a SiO$_2$-based material and the second insulating layer 150 is made of a Si(O)N-based material, the sacrificial spacers 150a are removed according to a wet etching process using phosphoric acid as the etchant and the first insulating layer 130 is removed according to a wet etching process using LAL as the etchant. Additionally, when the first insulating layer 130 is made of a Si(O)N-based material and the second insulating layer 150 is made of a SiO$_2$-based material, the sacrificial spacers 150a are removed according to a wet etching process using LAL as an etchant and the first insulating layer 130 is removed according to a wet etching process using phosphoric acid as the etchant.

Figure 10:
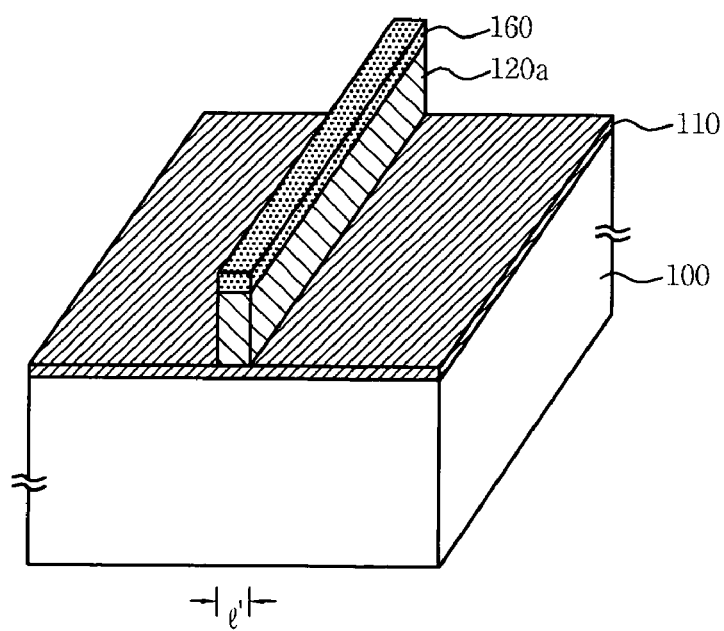

As shown in FIG. 10, the polysilicon layer 120 is etched using the arbitrary layer pattern 160 as a mask to form a gate electrode 120a with a width of $t$. At this time, $t$ is defined as "$t - (\alpha 1 + \alpha 2)$" as shown in FIG. 8.

According to exemplary embodiments of the present invention, an arbitrary layer pattern used as a hard mask is formed to a size that is not capable of being obtained via a photolithography process by controlling a thickness of sacrificial spacers, thereby reducing a width of a gate electrode.

In a conventional technology, the width of the gate electrode which can be reproducibly realized is $t$, but in the present invention, the width of the gate electrode 120a is $t'$ which is a value reduced by $\alpha 1 + \alpha 2$ in comparison with $t$.

As a result, the method according to exemplary embodiments of the present invention realizes a line width of a gate electrode in a fine pitch structure of 100 nm or less.

Figure 11:
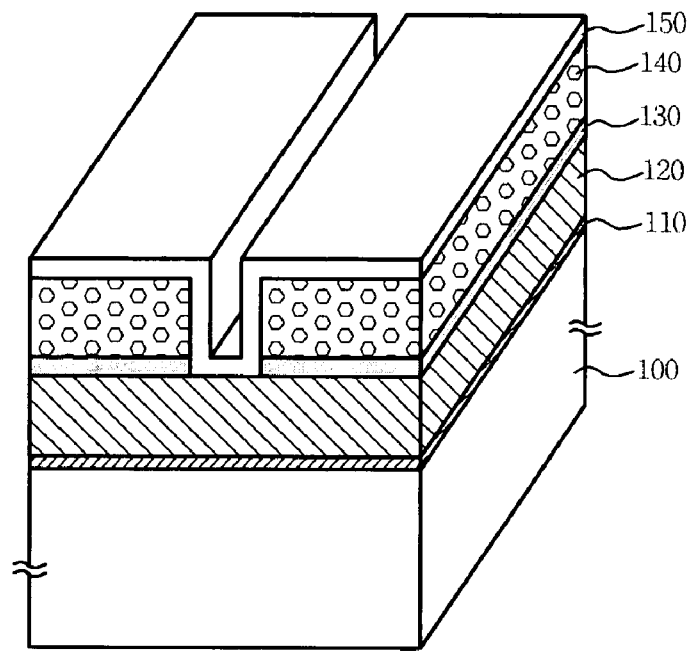
FIGS. 11–13 are perspective views illustrating the formation of a gate electrode of a transistor according to another embodiment of the present invention.
Figure 12:
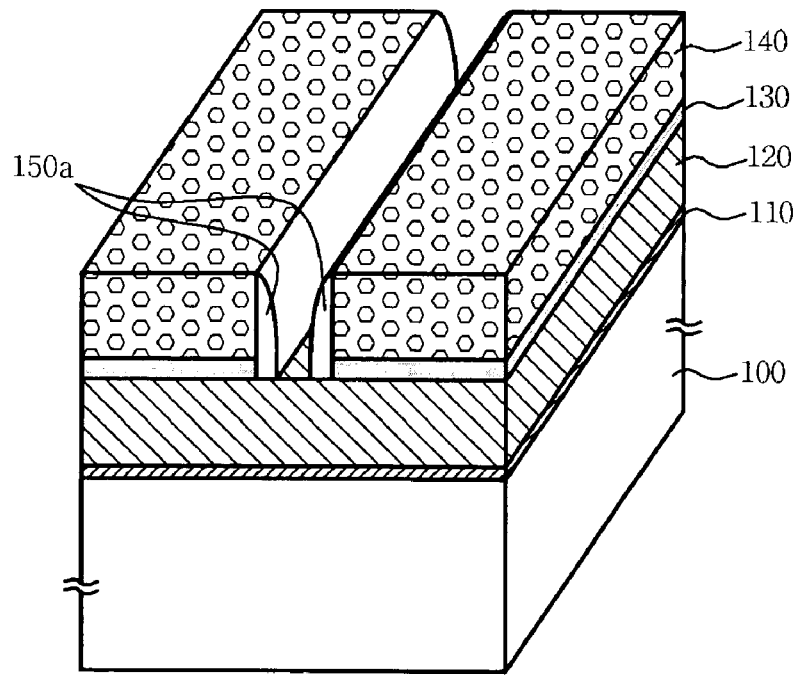
Figure 13:
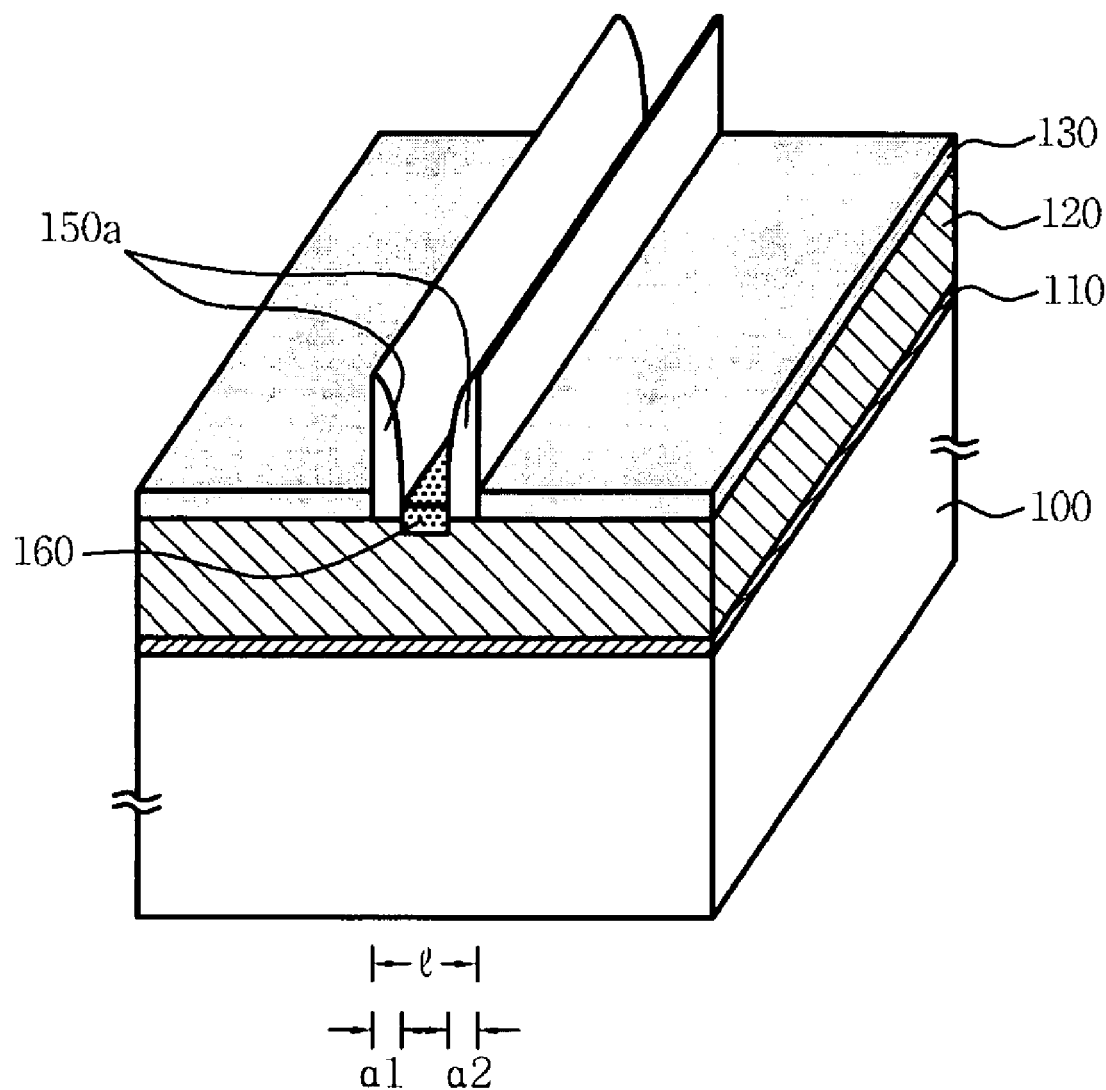

As shown in FIGS. 11–13, according to another embodiment of the present invention, a first insulating layer 130 is etched using the PR pattern 140 produced in FIG. 5 as a mask to form the groove (g) in the first insulating layer 130. A second insulating layer 150 is formed on the PR pattern 140 with the groove(t) and on the exposed portion of the polysilicon layer 120, and the second insulating layer 150 is etched by an etching back process to form sacrificial spacers 150a on the sidewalls of the grooves (g) and (t). In the present embodiment, the first insulating layer 130 is removed prior to formation of the sacrificial spacers 150a. Thus, a width of the gate electrode 120a is $t'$(where $t' = t - (\alpha 1 + \alpha 2)$).

The above-described embodiments of the present invention provide a procedure of patterning the gate electrode using a single metallization layer. However, it should be appreciated that in other embodiments of the present invention a gate electrode can be formed using a polysilicon metallization layer as a first metallization layer or metallization layers including Al or Cu as a second or a third metallization layer.

As described above, the various exemplary embodiments of the present invention provides an arbitrary layer pattern used as a hard mask. The hard mask is formed to a size that is much smaller than that obtained using the conventional photolithography process by controlling a thickness of sacrificial spacers, thereby reducing a width of a gate electrode. The present invention realizes a gate electrode in a fine pitch structure with a width of 100 nm or less.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of fabricating a semiconductor device, comprising the steps of:
   sequentially forming a polysilicon layer, a first insulating layer, and a photoresist layer over a gate insulating layer positioned on a semiconductor substrate;
   forming a photoresist pattern with a first groove by selectively patterning the photoresist layer to partially expose a surface of the first insulating layer;
   forming a second insulating layer over the photoresist pattern with the first groove and over the exposed surface of the first insulating layer;
   forming a sacrificial spacer on each inner wall of the first groove by etching back the second insulating layer and forming a second groove in the first insulating layer in communication with the first groove to expose a surface of the polysilicon layer at the bottom of the second groove;

removing the photoresist pattern;

forming an oxide layer pattern over the polysilicon layer at the bottom of the second groove;

removing the sacrificial spacers and first insulating layer; and forming a gate electrode by etching the polysilicon layer using the oxide layer pattern as a mask.

2. The method of claim 1, wherein the first insulating layer is made of $SiO_2$ or $Si(O)N$.

3. The method of claim 1, wherein the second insulating layer is formed by a low temperature chemical vapor deposition (LT CVD) process or an atomic layer deposition (ALD) process.

4. The method of claim 1, wherein the second insulating layer is formed at temperature of about 0.7 T to about 0.9 T, where T is a burning temperature of the photoresist layer.

5. The method of claim 1, wherein the second insulating layer is 350 Å or less in thickness.

6. The method of claim 1, wherein the oxide layer is formed by a thermal oxidation process.

7. The method of claim 2, wherein the first and second insulating layers are made of a $Si(O)N$-based material.

8. The method of claim 7, wherein the sacrificial spacers and first insulating layer are removed by a wet etching process using phosphoric acid as an etchant.

9. The method of claim 1, wherein the photoresist layer is KrF or ArF.

10. The method of claim 9, wherein the photoresist layer is 1500 to 3000 Å in thickness.

11. The Method of claim 9, wherein the width of the gate electrode is 100 nm or less.

12. A method of fabricating a semiconductor device, comprising the steps of:

sequentially forming a conductive layer, a first insulating layer, and a photoresist layer over a semiconductor substrate;

forming a photoresist pattern with a first groove by selectively patterning the photoresist layer to partially expose a surface of the first insulating layer;

forming a second insulating layer over the photoresist pattern with the first groove and over the exposed surface of the first insulating layer;

forming a sacrificial spacer on each inner wall of the first groove by etching back the second insulating layer and forming a second groove in the first insulating layer in communication with the first groove to expose a surface of the conductive layer at the bottom of the second groove;

removing the photoresist pattern;

forming an oxide layer pattern over the conductive layer at the bottom of the second groove;

removing the sacrificial spacers and the first insulating layer; and forming a metallization by etching the conductive layer using the oxide layer pattern as a mask.

13. The method as set forth in claim 12, wherein the conductive layer comprises Al or Cu.

14. A method of fabricating a semiconductor device, comprising the steps of:

sequentially forming a conductive layer, a first insulating layer, and a photoresist layer over a semiconductor substrate;

forming a photoresist pattern with a first groove by selectively patterning the photoresist layer to partially expose a surface of the first insulating layer;

etching the first insulating layer using the photoresist pattern as a mask to form a second groove in the first insulating layer that exposes a surface of the conductive layer;

forming a second insulating layer over the photoresist pattern with the first groove and over the exposed surface of the conductive layer;

forming a sacrificial spacer on each inner wall of the first groove by etching back the second insulating layer to expose the surface of the conductive layer at the bottom of the second groove;

removing the photoresist pattern;

forming an oxide layer pattern over the conductive layer at the bottom of the second groove;

removing the sacrificial spacers and the first insulating layer; and forming a metallization by etching the conductive layer using the oxide layer pattern as a mask.

15. The method of claim 14, wherein the conductive layer comprises a metal selected from a group consisting of polysilicon, Al, and Cu.

16. A method of fabricating a semiconductor device, comprising the steps of:

sequentially forming a conductive layer, a first insulating layer, and a photoresist layer over a semiconductor substrate;

forming a photoresist pattern with a first groove by selectively patterning the photoresist layer to partially expose a surface of the first insulating layer;

etching the first insulating layer using the photoresist pattern as a mask to form a second groove in the first insulating layer that exposes a surface of the conductive layer;

forming a second insulating layer over the photoresist pattern with the first groove and over the exposed surface of the first insulating layer;

forming a sacrificial spacer on each inner wall of the first groove by etching back the second insulating layer to expose the surface of the conductive layer at the bottom of the second groove;

removing the photoresist pattern;

forming an oxide layer pattern over the polysilicon layer at the bottom of the second groove;

removing the sacrificial spacers and first insulating layer; and forming a gate electrode by etching the polysilicon layer using the oxide layer pattern as a mask.

17. The method of claim 16, wherein the gate electrode has a width of 100 nm or less.

* * * * *